(12) United States Patent
Onishi et al.

(10) Patent No.: US 9,070,696 B2
(45) Date of Patent: Jun. 30, 2015

(54) SEMICONDUCTOR DEVICE MANUFACTURING METHOD AND SEMICONDUCTOR DEVICE

(71) Applicant: FUJI ELECTRIC CO., LTD., Kawasaki-shi (JP)

(72) Inventors: Kazunaga Onishi, Matsumoto (JP); Rikihiro Maruyama, Matsumoto (JP); Masafumi Tezuka, Matsumoto (JP); Masahiro Kikuchi, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/251,036

(22) Filed: Apr. 11, 2014

(65) Prior Publication Data
US 2014/0312464 A1      Oct. 23, 2014

(30) Foreign Application Priority Data
Apr. 18, 2013   (JP) ................................. 2013-087899

(51) Int. Cl.
*H01L 21/56* (2006.01)
*H01L 23/544* (2006.01)
*H01L 23/00* (2006.01)

(52) U.S. Cl.
CPC ............ *H01L 21/565* (2013.01); *H01L 23/544* (2013.01); *H01L 2223/54426* (2013.01); *H01L 24/49* (2013.01); *H01L 24/85* (2013.01); *H01L 2924/13055* (2013.01); *H01L 2924/1305* (2013.01)

(58) Field of Classification Search
CPC ................ H01L 21/565; H01L 23/544; H01L 2223/54426; H01L 24/49; H01L 24/85; H01L 2924/13055; H01L 2924/1305
See application file for complete search history.

(56) References Cited

U.S. PATENT DOCUMENTS

2008/0217760 A1    9/2008  Yoshihara et al.

FOREIGN PATENT DOCUMENTS

| JP | H09-008223 A | 1/1997 |
| JP | 2004-134518 A | 4/2004 |
| JP | 2009-021286 A | 1/2009 |

OTHER PUBLICATIONS

Next Generation IGBT Module "NX Series" with new package concept, Jan. 2007.

*Primary Examiner* — Long Pham
(74) *Attorney, Agent, or Firm* — Manabu Kanesaka

(57) ABSTRACT

In a method of manufacturing a semiconductor device, a molding die for molding a resin case for a semiconductor device is prepared such that the molding die has protrusions to fix each of a plurality of terminals having a leg portion in a predetermined position. Each of the plurality of terminals is held to the corresponding protrusions in the molding die, and resin is injected into the molding die to integrally mold the plurality of terminals and the resin case.

6 Claims, 13 Drawing Sheets

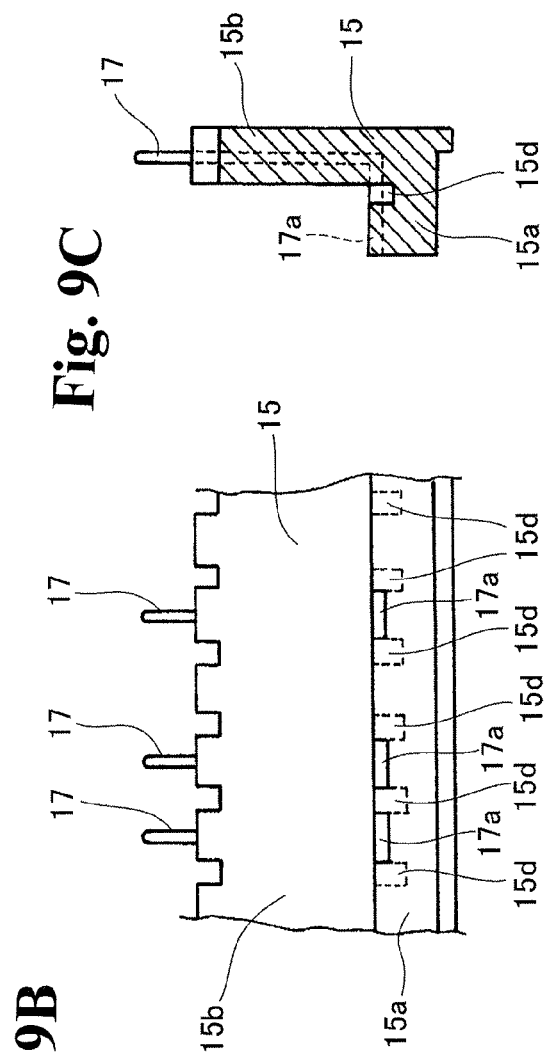

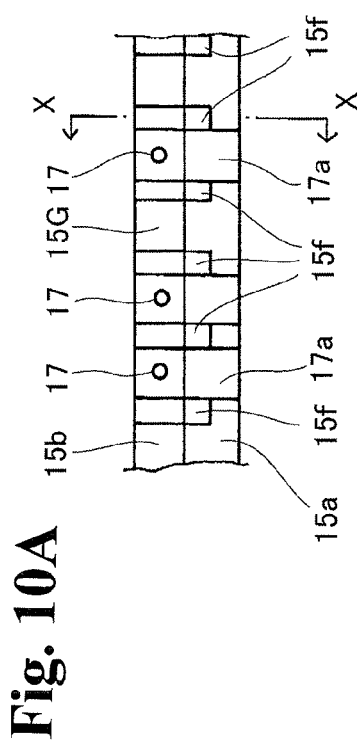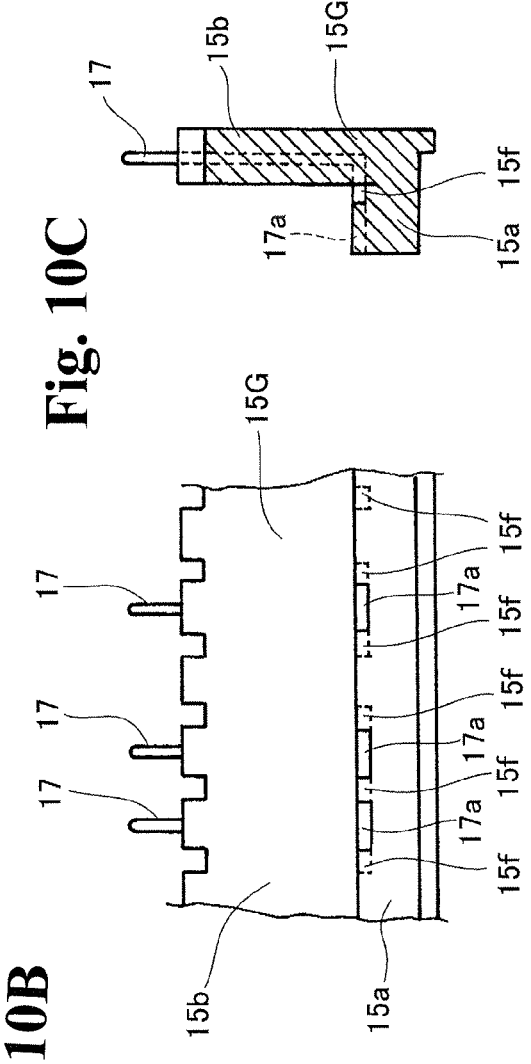

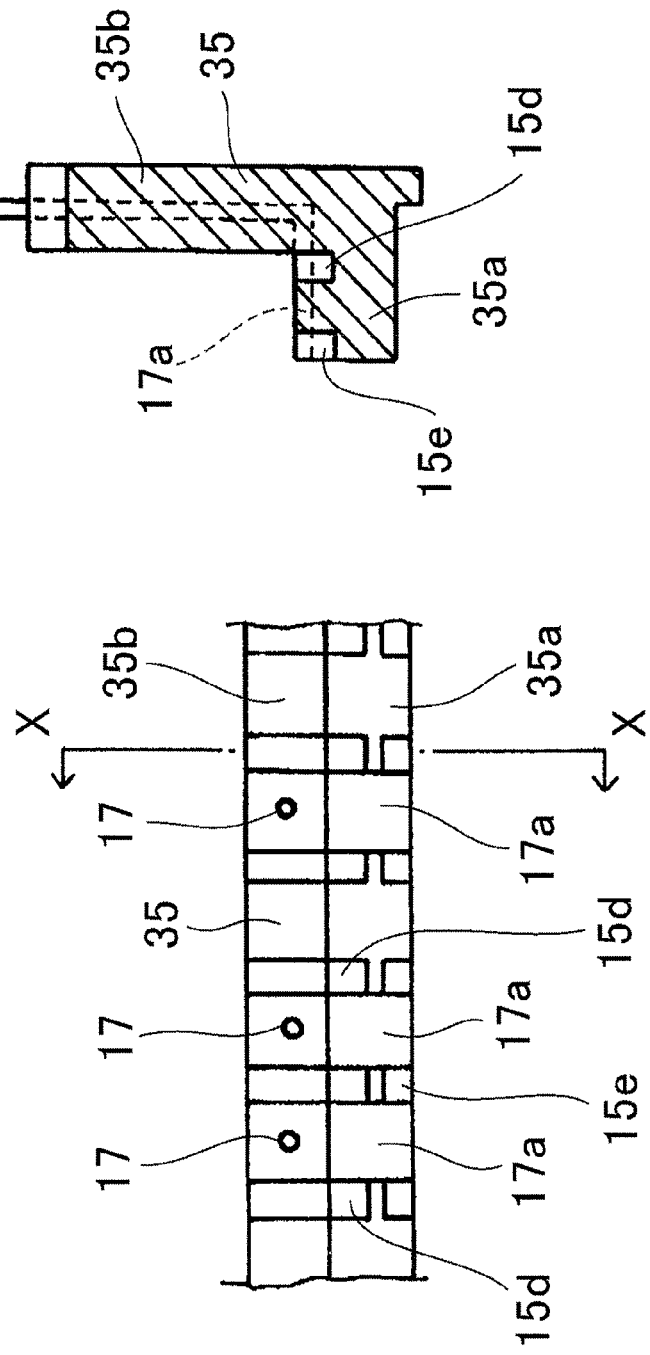

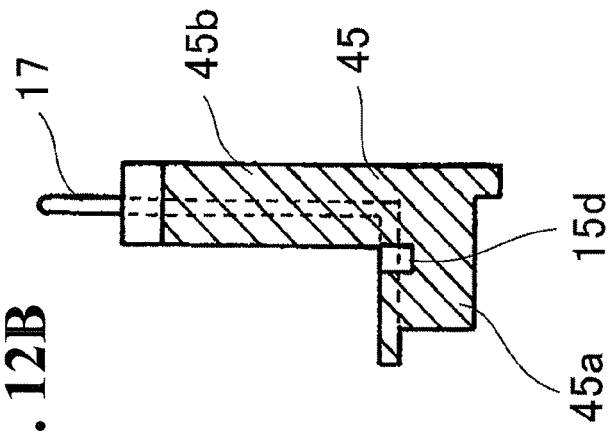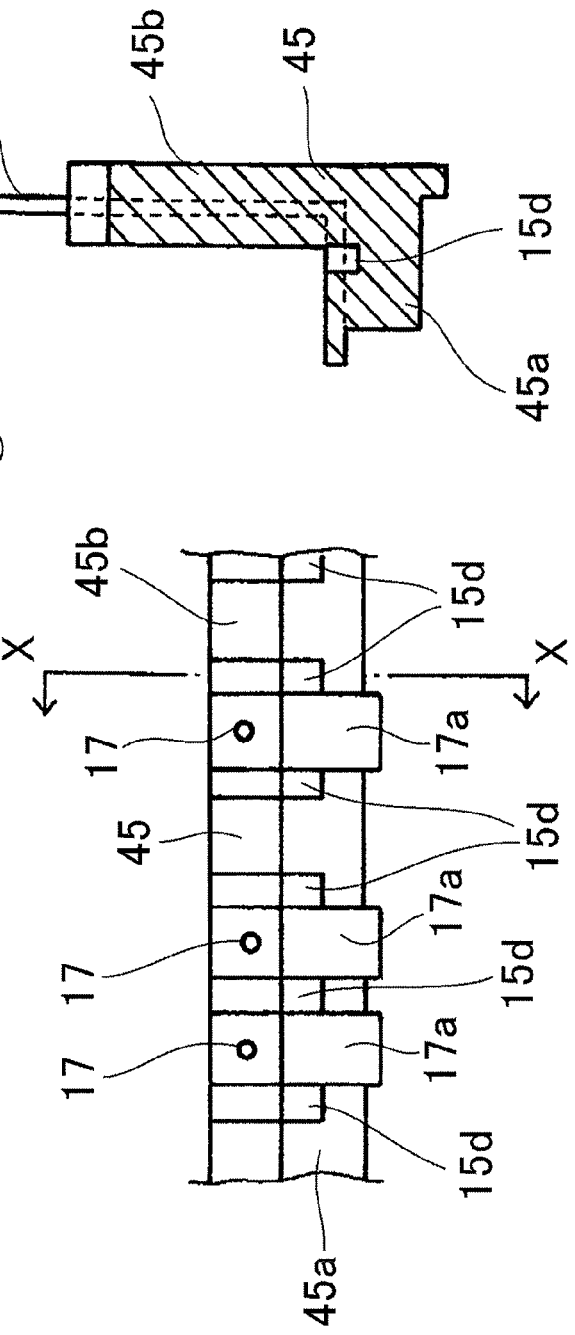

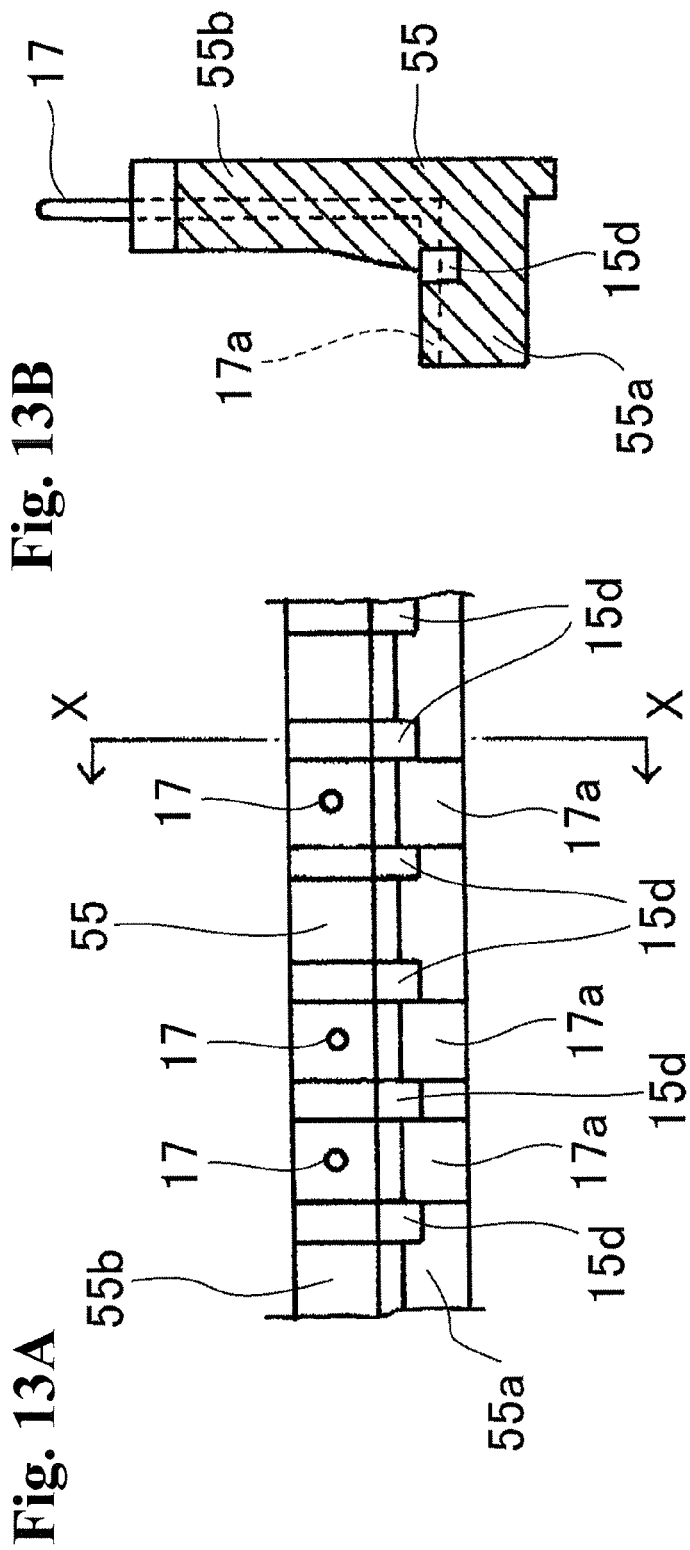

SEMICONDUCTOR DEVICE MANUFACTURING METHOD AND SEMICONDUCTOR DEVICE

RELATED APPLICATIONS

The present application claims priority from Japanese Application No. 2013-087899 filed Apr. 18, 2013.

BACKGROUND OF THE INVENTION

1. Field of the Invention

The present invention relates to a semiconductor device manufacturing method and semiconductor device. In particular, the invention relates to a semiconductor device manufacturing method wherein an insulating circuit substrate mounted with a semiconductor element is housed inside a resin case, and a terminal is integrally molded with the resin case.

2. Description of the Background Art

A semiconductor module wherein a plurality of power semiconductor elements, such as an insulated gate bipolar transistor (IGBT) or freewheeling diode (FWD) is housed inside a resin case is known as a semiconductor device that controls a motor or the like.

One example of this semiconductor module is such that a power semiconductor element is mounted on an insulating circuit substrate. The insulating circuit substrate is such that an electrical circuit formed of a conductive layer is formed on a surface of an insulating substrate, and the power semiconductor element is electrically connected via a solder to the electrical circuit. The insulating circuit substrate mounted with the power semiconductor element is housed inside a resin case. A terminal is provided in the resin case. The conductive layer electrical circuit of the insulating circuit substrate, or the power semiconductor element, is electrically connected with a bonding wire to the terminal. The terminal can be electrically connected as a main terminal or control terminal to the exterior of the resin case. The insulating circuit substrate mounted with the power semiconductor element is joined Lo the resin case with an adhesive. A sealing resin is injected into the resin case, and prevents moisture and the like from entering the resin case, thus protecting the power semiconductor element and the like.

As one example, the terminal has an L-shape having a leg portion. As one example, the resin case has a box shape having a side wall portion provided on each of four sides. The L-shaped terminal is provided in the resin case so that a leading end portion of the terminal is exposed from an upper end of the side wall portion of the resin case, and the leg portion of the terminal is exposed on the inner surface side of the side wall portion of the resin case. The number and positions of terminals in the side wall portion of the resin case differ for each semiconductor module product.

As a method of manufacturing a resin case wherein terminals are provided integrally, there is the following method.

A terminal member wherein terminals are connected by tie bars for a number and position corresponding to one side wall portion of the resin case is prepared for each side wall of the resin case by carrying out a punching process and bending process on a thin plate of a conductive material, such as a copper plate. The terminal members are positioned to correspond to each of the side walls of the resin case in a molding die in which the resin case is to be molded, and the terminals are insert molded integrally with the resin case by a raw material resin such as a polyphenylene sulfide (PPS) resin being injected into the molding die and hardened. After molding, the tie bar is cut off.

However, while this method is suited to mass production, the terminal member is of a configuration wherein the terminals are connected by the tie bar so as to be in predetermined positions, because of which unnecessary portions between terminals are thrown away in the punching process. Consequently, the proportion of the portion of the thin plate of conductive material used for the terminals is low, and the terminal cost is high. Also, when manufacturing resin cases with differing terminal layouts, it is necessary to separately prepare different molding dies in accordance with the number and positions of the terminals, and the molding die cost is high because of the need to prepare a plurality of molding dies.

Another method of manufacturing a resin case wherein terminals are provided integrally is such that terminal attachment holes are formed in a side wall portion of the resin case in the resin case molding step so as to be compatible with all terminal arrays differing in accordance with model and specifications, and individual terminals are press fitted in predetermined positions into the attachment holes formed (JP-A-2008-252055 (Description of the Background Art, Claims)).

With this method, one resin case molding die is sufficient even when manufacturing resin cases with differing terminal numbers and positions, and the molding die cost is lower than with the previously described method. Also, as it is sufficient that individual terminals of the same form are manufactured from a thin plate of a conductive material, the proportion of the portion of the thin plate of conductive material used for the terminals is high, and the terminal cost is lower than with the previously described method. Also, standardization is also possible for the resin case, and the member cost is therefore low. However, as an operation of fitting the terminals one by one into the terminal attachment holes is necessary for the number of terminals provided in the resin case, the operation cost is high. Also, as it is necessary to attach a terminal holding frame on the bottom surface of the side wall portion of the resin case after the press fitting of the terminals, and fix the terminal holding frame using an adhesive, in order to prevent looseness of the leg portion of the terminal and secure wire bondability, a terminal holding frame manufacturing cost and adhesive cost are incurred. Consequently, the overall cost reduction is insufficient.

Another method of manufacturing a resin case wherein terminals are provided integrally is such that protruding portions having elasticity are formed on an inner surface side of a side wall portion of the resin case, and terminals are clamped by the protruding portions (JP-A-2009-21286 (Claims)). With this method too, one resin case molding die is sufficient even when manufacturing resin cases with differing terminal numbers and positions, and the molding die cost is lower than with the previously described insert molding method. Also, as it is sufficient that individual terminals of the same form are manufactured from a thin plate of a conductive material, the proportion of the portion of the thin plate of conductive material used for the terminals is high, and the terminal cost is lower than with the previously described method. Also, standardization is also possible for the resin case, and the member cost is therefore low. However, as an operation of attaching the terminals one by one into the protrusions is necessary for the number of terminals provided in the resin case, the operation cost is high. Also, as it is necessary to fix a universal guide including the protrusions to the case using an adhesive, a universal guide manufacturing cost and adhesive cost are incurred. Consequently, the overall cost reduction is insufficient. Also, as it is necessary that the protruding portions of the resin case are formed of a material having elasticity, it is not possible to use a PPS resin or the like, which have low elasticity.

A semiconductor device wherein terminals of the same form are integrally molded in a side wall portion of a resin case using a molding die is described in JP-A-9-8223 (Paragraph [0117], FIG. 3) and JP-A-2004-134518 (Paragraph [0051]). However, it is not necessarily clear in JP-A-9-8223 (Paragraph [0117], FIG. 3) and JP-A-2004-134518 (Paragraph [0051]) whether the method described in JP-A-2008-252055 (Description of the Background Art, Claims) or the method described in JP-A-2009-21286 (Claims) is used as the method for molding the terminals integrally with the resin case.

SUMMARY OF THE INVENTION

The invention, having been contrived in order to advantageously solve the heretofore described problems, has an object of providing a semiconductor device manufacturing method and semiconductor device such that it is possible to reduce the manufacturing cost of a semiconductor device wherein a resin case and terminal are provided integrally.

In order to achieve the heretofore described object, one aspect of the invention is a method of manufacturing a semiconductor device having a resin case including a plurality of terminals having a leg portion, and an insulating circuit substrate mounted with at least one semiconductor element and attached to a resin case. The method includes preparing a molding die for molding the resin case, the molding die having protrusions to fix each of the plurality of terminals in a predetermined position; conforming and holding each of the plurality of terminals to the corresponding protrusions in the molding die; and injecting resin into the molding die to integrally mold the plurality of terminals and the resin case.

Also, as another aspect of the invention, a semiconductor device includes an insulating circuit substrate mounted with at least one semiconductor element, a resin case provided with a plurality of terminals having a leg portion. The plurality of terminals and the resin case are integrally molded. Protrusion marks of protrusions fixing each of the plurality of terminals in a predetermined position in a molding die are formed in a vicinity of the leg portion of the plurality of terminals of the resin case.

According to the heretofore described aspects of the invention, protrusions fixing each of a plurality of terminals in a predetermined position are provided in a molding die for molding a resin case, each of the plurality of terminals is matched with and held by the corresponding protrusions in the molding die, and insert molding is carried out, because of which it is possible to reduce the overall cost.

BRIEF DESCRIPTION OF THE DRAWINGS

FIGS. 5A to 5C are illustrations of one example of a molding die for molding a resin case; wherein FIG. 5A is a partial cross-sectional view of a molding die, FIG. 5B is a partial cross-sectional view taken along the line B-B of FIG. 5A, and FIG. 5C is a partial cross-sectional view taken along the line C-C of FIG. 5A.

FIGS. 6A to 6C are partial cross-sectional views of a modification example of a molding die; wherein FIG. 6A is a partial cross-sectional view of a molding die, FIG. 6B is a partial cross-sectional view taken along the line B-B of FIG. 6A, and FIG. 6C is a partial cross-sectional view taken along the line C-C of FIG. 6A.

FIGS. 9A to 9C are illustrations of a resin case; wherein FIG. 9A is a partial plan view of the side wall portion of the resin case, FIG. 9B is a partial side view of the side wall portion viewed from the inner surface side, and FIG. 9C is a partial cross-sectional view cut along the line X-X of FIG. 9A.

FIGS. 10A to 10C are illustrations of a modification example of a resin case; wherein FIG. 10A is a partial plan view of the side wall portion of a resin case, FIG. 10B is a partial side view of the side wall portion viewed from the inner surface side, and FIG. 10C is a partial cross-sectional view cut along the line X-X of FIG. 10A.

FIGS. 11A and 11B are illustrations of a modification example of a resin case; wherein FIG. 11A is a partial plan view of a side wall portion of a resin case, and FIG. 11B is a partial cross-sectional view cut along the line X-X of FIG. 11A.

FIGS. 12A and 12B are illustrations of a modification example of a resin case; FIG. 12A is a cross-sectional view of a side wall portion of a resin case, and FIG. 12B is a partial cross-sectional view cut along the line X-X of FIG. 12A.

FIGS. 13A and 13B are illustrations of a modification example of a resin case; FIG. 13A is a cross-sectional view of a side wall portion 55b of a resin case 55, and FIG. 13B is a partial cross-sectional view cut along the line X-X of FIG. 13A.

DETAILED DESCRIPTION OF THE INVENTION

A specific description will be given, using the drawings, of embodiments of a semiconductor device manufacturing method and semiconductor device of the invention.

Figure 1:
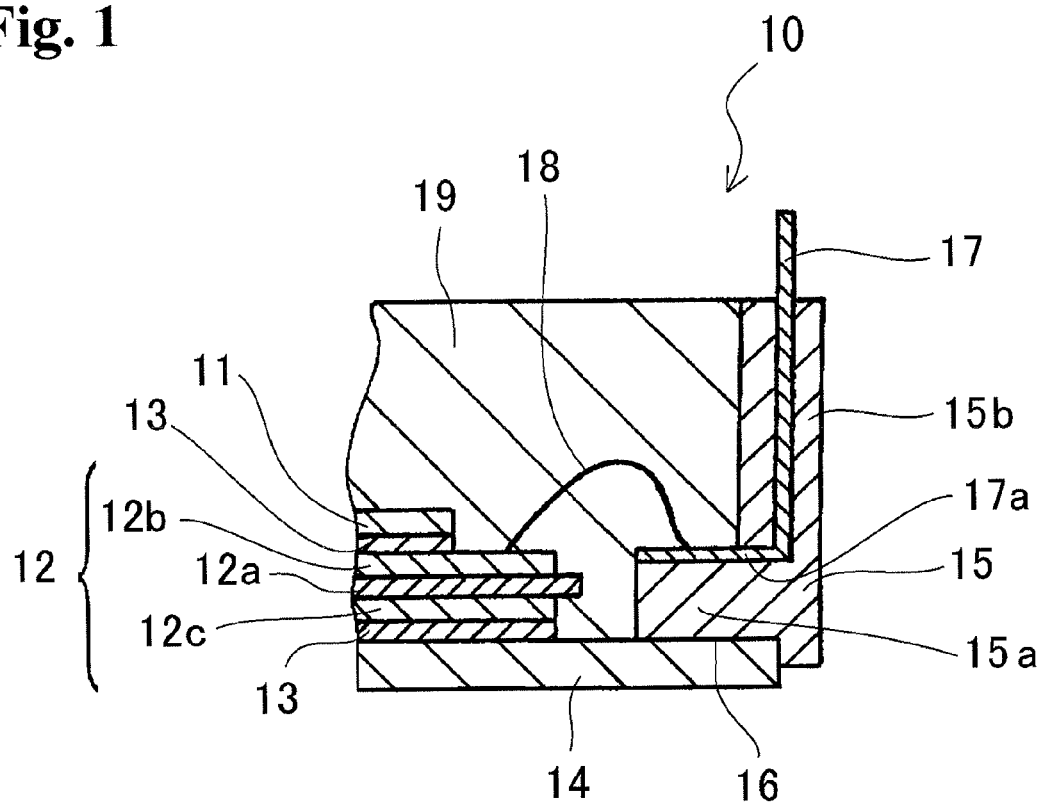
FIG. 1 is a cross-sectional view of a main portion of a semiconductor device of one embodiment of the present invention.

A semiconductor device 10 of one embodiment of the invention is shown in FIG. 1 as a cross-sectional view of a main portion. In FIG. 1, the semiconductor device 10 is such that a semiconductor chip is mounted on an insulating circuit substrate 12. The semiconductor chip 11 can he, for example, an insulated gate bipolar transistor (IGBT) or freewheeling diode (FWD).

The insulating circuit substrate 12 is formed of an insulating substrate 12a and conductor layers 12b and 12c formed one each on one surface and the other surface of the insulating substrate 12a. The semiconductor chip 11 is electrically connected by being joined by the conductor layer 12b, on which a circuit pattern is formed, and a solder 13. The conductor layer 12c of the insulating circuit substrate 12 is joined by a heat releasing substrate 14 and the solder 13. The insulating circuit substrate 12 on which the semiconductor chip 11 is mounted is housed in a resin case 15. The resin case 15 is formed of one kind of resin chosen from, for example, a polyphenylene sulfide resin (PPS resin), a polybutylene terephthalate resin (PBT resin), a polyamide resin (PA resin), or an acrylonitrile butadiene styrene resin (ABS resin).

Figure 2:
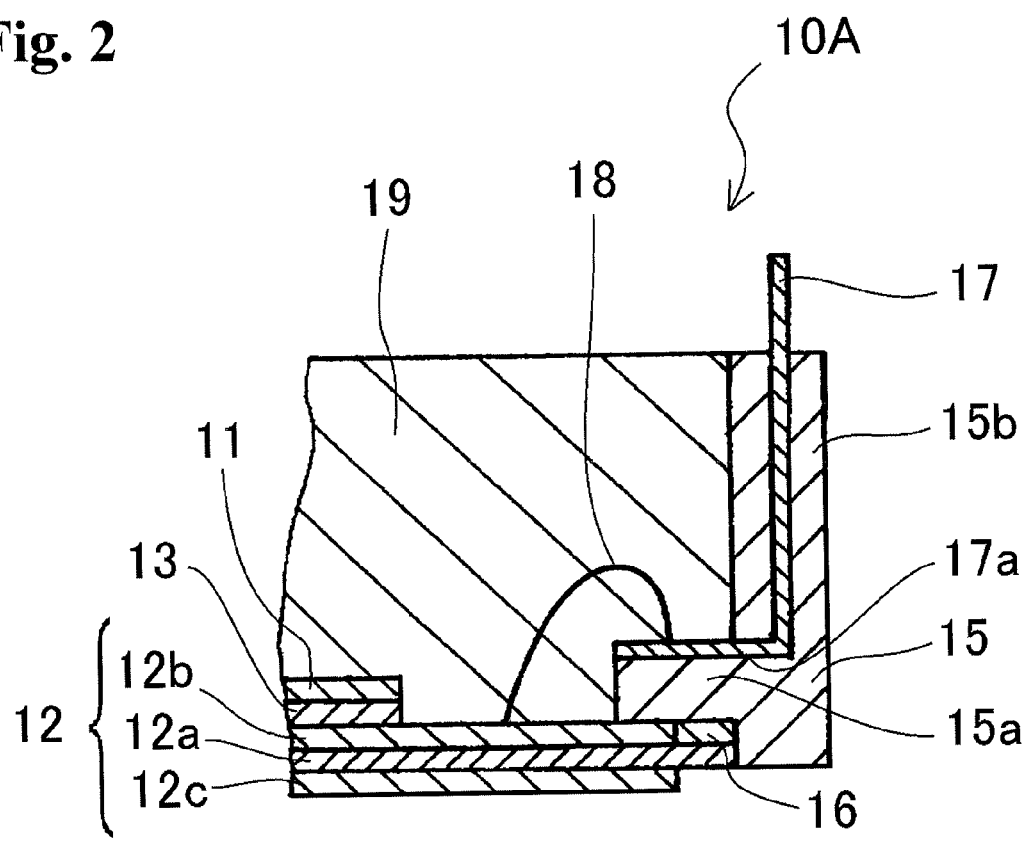
FIG. 2 is a cross-sectional view of a main portion of the semiconductor device of another embodiment of the present invention.

Although the semiconductor device 10 shown in FIG. 1 includes the heat releasing substrate 14, the semiconductor device of the invention is not limited to being a semiconductor device that includes the heat releasing substrate 14. A main portion of a semiconductor device that does not include the heat releasing substrate 14 is shown in a cross-sectional view as a semiconductor device 10A of another embodiment of the invention in FIG. 2. In FIG. 2, the same reference signs are given to members the same as those in FIG. 1, and a redundant description of each member will be omitted. The semiconductor device 10A of FIG. 2 is such that one portion of the insulating circuit substrate 12, the conductor layer 12c portion in the example shown in the drawing, protrudes below the resin case 15. The insulating circuit substrate 12 and resin case 15 are fixed with an adhesive 16.

Figure 3:
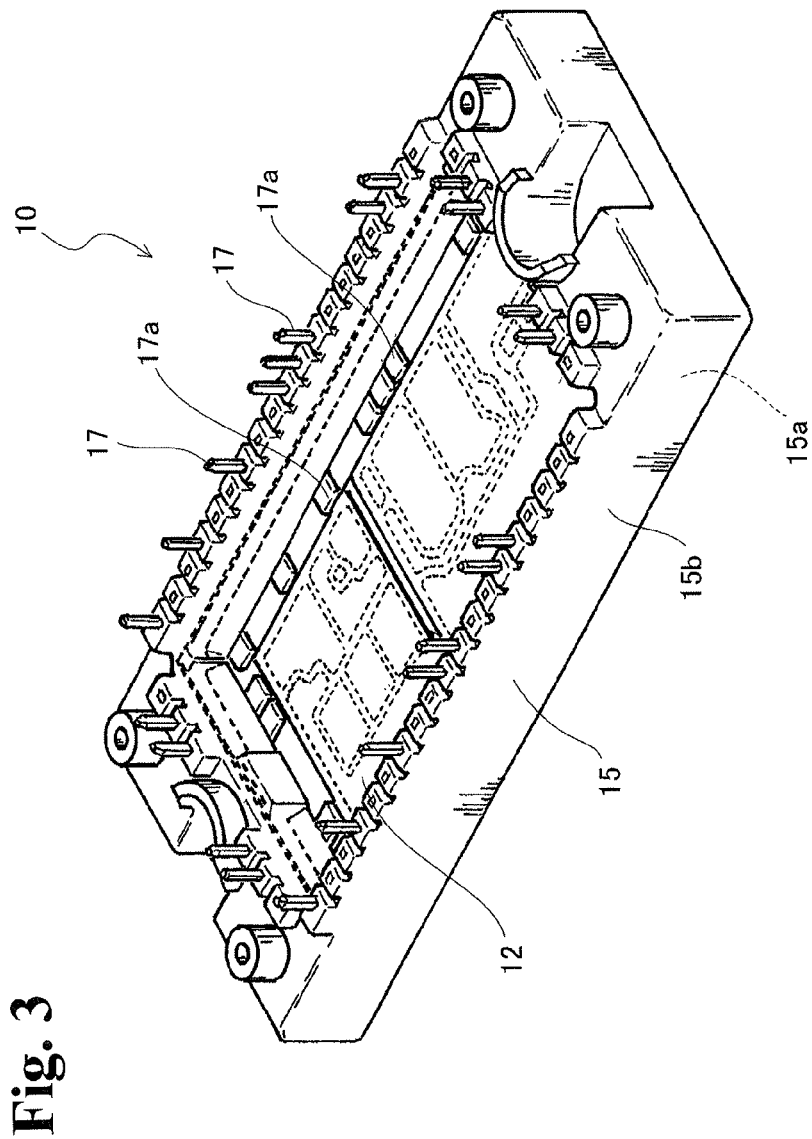
FIG. 3 is a perspective view of the semiconductor device of FIG. 1.
Figure 4:
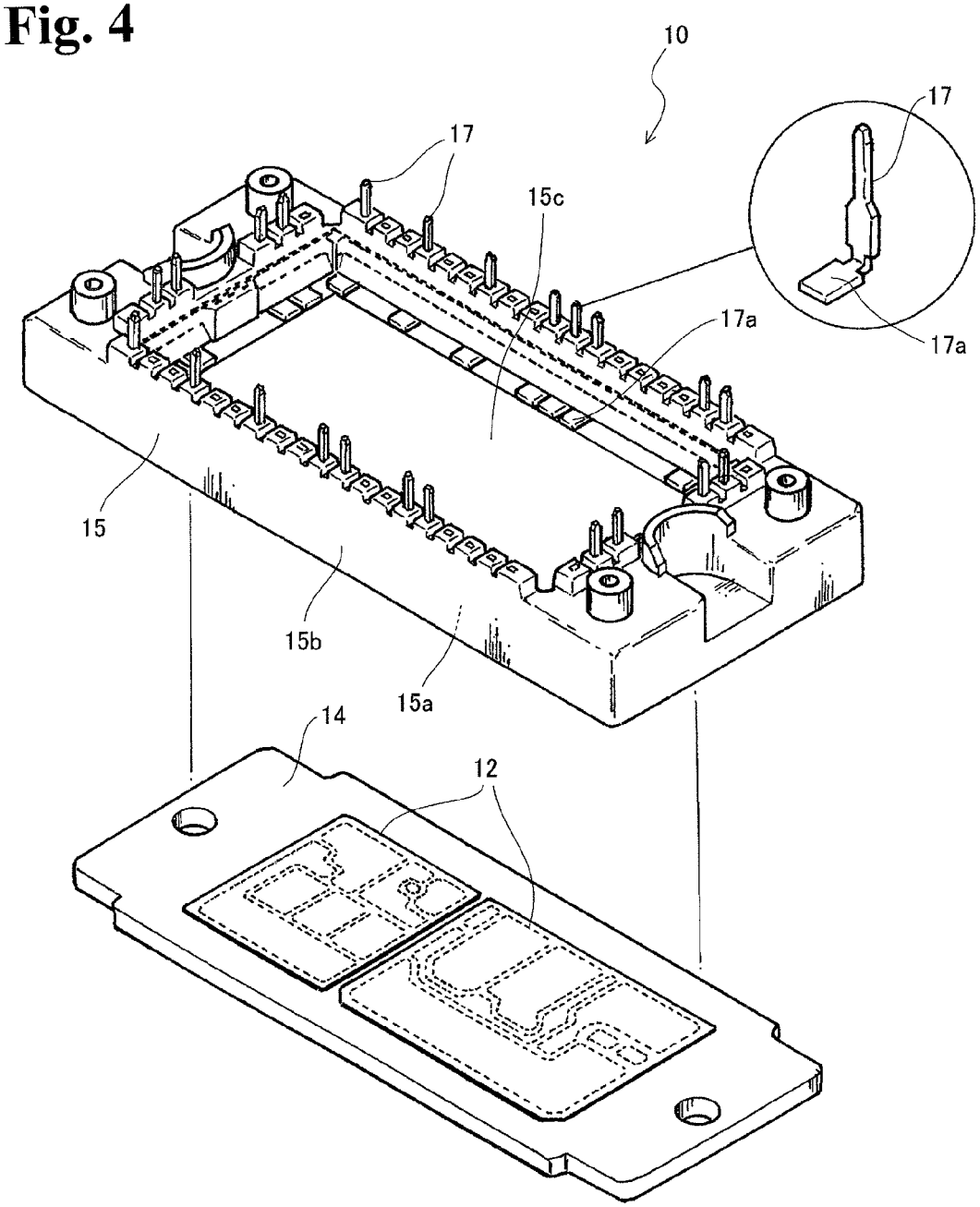
FIG. 4 is an exploded perspective view of FIG. 3.

FIG. 3 shows a perspective view of the semiconductor device 10 of FIG. 1, while FIG. 4 shows an exploded perspective view of FIG. 3. In FIGS. 3 and 4, a depiction of the semiconductor chip 11 mounted on the insulating circuit substrate 12 is omitted in order to facilitate understanding of the invention. The resin case 15 includes a bottom portion 15a and a side wall portion 15b, and has a substantially rectangular shape when viewed from above, as shown in FIG. 3. An aperture 15c is formed in a central portion of the bottom portion 15a of the resin case 15, as shown in the exploded perspective view of FIG. 4. The heat releasing substrate 14 is fixed to the bottom portion 15a of the resin case 15 with the adhesive 16, as shown in FIG. 1. The insulating circuit substrate 12 provided on the upper surface of the heat releasing substrate 14 is exposed through the aperture 15c of the resin case 15.

A terminal 17 used as a main terminal or control terminal is provided inside the side wall portion 15b of the resin case 15. The terminal 17 shown in the drawing has an L-shape, wherein one end having a pin (rod) shape is exposed from the upper end of the side wall portion 15b of the resin case 15, while the other end having a plate form, is exposed as a leg portion 17a from the inner surface side of the side wall portion 15b. For the material of the terminal 17, copper, a copper alloy (brass, phosphor bronze, a C194 copper alloy, or the like), aluminum, a copper/aluminum clad material, or a copper-clad aluminum material can be used as a conductive material. Also, it is possible to use a material wherein a conductive plating is applied to these conductive materials for the terminal 17. There is a terminal member called a reel terminal, formed of these materials and wound into a reel wherein a plurality of terminals of the same form is linked. After forming the leg portion 17a of the terminal 17 by a process of bending the reel terminal, a plurality of the terminal 17 can be obtained by individually separating the terminals using a cutting process.

The conductor layer 12b of the insulating circuit substrate 12, or the semiconductor chip 11, is electrically connected with bonding wire 18 to the leg portion 17a of the terminal 17 (refer to FIG. 1). The inside of the resin case 15, in which the bonding wire 18 is connected, is filled with a sealing resin 19 formed of a silicone resin, an epoxy resin, or the like. The semiconductor chip 11, terminal 17, conductor layer 12b, and the like, inside the resin case 15 are protected by the sealing resin 19.

The resin case 15 provided with the terminal 17 is manufactured by a so-called insert molding wherein, after the terminal 17 is provided inside a molding die in which the resin case 15 is to be molded, resin is injected into the molding die, and the resin case 15 and terminal 17 are integrated by the terminal 17 being enveloped in the resin and the resin hardened.

Figure 5A:
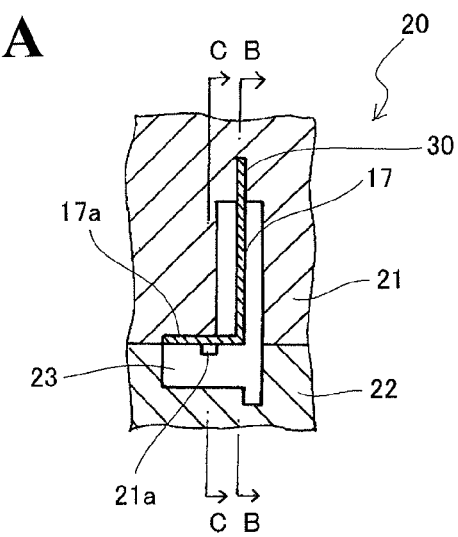
Figure 5B:
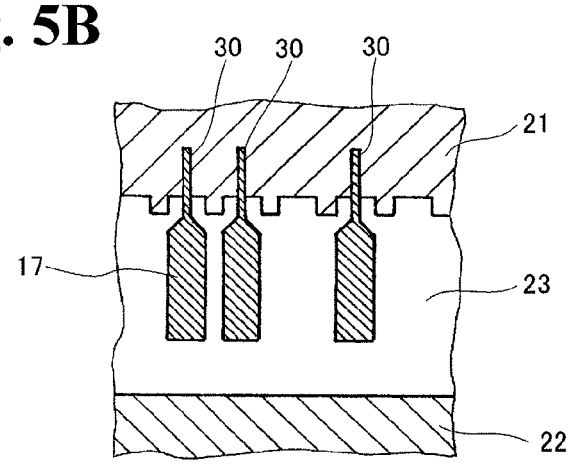
Figure 5C:
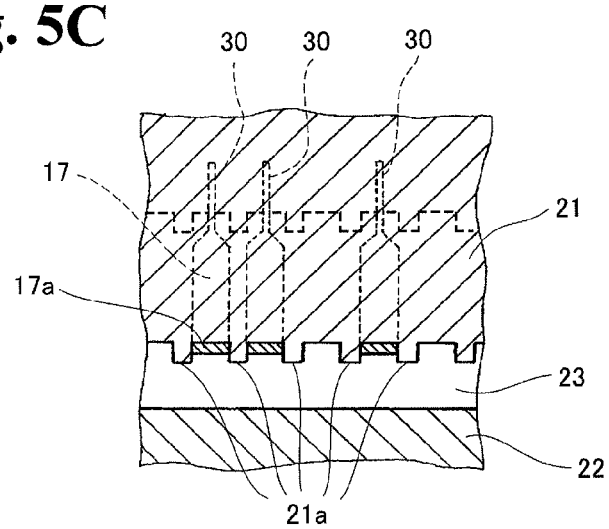

One example of a molding die for molding the resin case 15 is shown as partial cross-sectional views in FIGS. 5A to 5C. FIG. 5A is a partial cross-sectional view of a molding die in which is molded the vicinity of the side wall portion 15b of the resin case 15 shown in FIG. 1, FIG. 5B is a partial cross-sectional view taken along the line B-B of FIG. 5A, and FIG. 5C is a partial cross-sectional view taken along the line C-C of FIG. 5A. A molding die 20 is configured of an upper die 21 and lower die 22, and a cavity 23 is formed by the two close contacting each other. A plurality of the terminal 17 to be provided in the side wall portion 15b of the resin case 15 is individually held in the upper die 21.

Protrusions 21a that fix each of the plurality of terminals 17 of the same form in a predetermined position are provided on either the upper die or the lower die of the molding die, on which the terminals are to be attached, which is the upper die 21 in this embodiment. In the example shown in FIGS. 5A to 5C, the protrusions 21a are provided in positions corresponding to the vicinity of the base of the leg portions 17a of the terminals 17 held in the upper die 21, as shown in FIGS. 5A and 5C. In the upper die 21, hole portions 30 holding the pin-form one end of the terminals 17 are provided at the same pitch as that of the protrusions 21a. Each of the plurality of terminals 17 of the same form is prepared in advance. The individual terminals 17 can be fabricated by, for example, separating the terminals using a cutting process after forming the leg portions 17a of the terminals 17 by a process of bending a reel terminal. Each of the separated terminals 17 is adjusted to the predetermined position by being sandwiched between protrusions 21a and inserted into the hole portions 30, whereby the terminals 17 are held in the upper die 21. Subsequently, the upper die 21 and lower die 22 are close contacting each other, after which resin is injected into the cavity 23 of the molding die 20, thereby integrally molding the plurality of terminals 17 and the resin case 15.

By each of the plurality of terminals 17 being held in the upper die of the molding die 20, as heretofore described, there is no need for a terminal member of a configuration wherein terminals disposed in predetermined positions are connected with a tie bar to be fixed to the molding die, as is the case with a heretofore known insert molding. The terminals 17 are such that it is sufficient that individual terminals of the same form are manufactured from a thin plate of a conductive material, because of which the proportion of the portion of the thin plate of conductive material used for the terminals is high, and the terminal cost is low. Therefore, it is possible to reduce the terminal cost.

Also, by insert molding being carried out with each of the plurality of terminals 17 of the same form held in the predetermined position in the upper die 21, it is possible for the lower die 22 to be standardized even when molding resin cases wherein the positions and number of the terminals 17 differ. That is, although different molding dies are needed for the upper die 21 in accordance with the positions and number of the terminals 17, it is sufficient to use the same molding die for the lower die 22. Consequently, as it is possible to standardize the lower die 22, it is possible to reduce the molding die cost in comparison with a heretofore known insert molding.

Furthermore, by insert molding being carried out with each of the plurality of terminals 17 provided in the upper die 21, it is possible to reduce the cost of the operation of attaching the terminals 17 to the resin case 15 in comparison with the manufacturing methods described in JP-A-2008-252055 and JP-A-2009-21286. Also, unlike the manufacturing methods described in JP-A-2008-252055 and JP-A-2009-21286, there is no need to attach a terminal holding frame, and fix the terminal holding frame by bonding using an adhesive. Furthermore, the material of the resin case 15 not being limited to a material having elasticity, it is possible to use a PPS resin, or the like, which has little elasticity but has superior electrical insulating properties, or the like.

From the above, it is shown that it is possible to reduce the cost overall by insert molding each of the plurality of terminals 17 using the molding die used in FIGS. 5A to 5C.

The protrusions 21a of the upper die 21 shown in FIGS. 5A to 5C are provided in order to hold each of the plurality of terminals 17 of the same form in the predetermined position. By the protrusions 21a being provided, it is possible to prevent deviation in the positions of the terminals 17 due to the injection pressure when injecting resin into the molding die, and thus possible to reliably fix the terminals 17 in the predetermined positions.

In order that it is possible to reliably fix the terminals in the predetermined positions, it is preferable that the protrusions 21a are provided in positions corresponding to the vicinity of the base of the leg portions 17a of the terminals 17 held in the upper die 21. Also, although it is possible to obtain the heretofore described advantages provided that at least one of the protrusions 21a is provided for one terminal 17 on the side supporting the terminal 17 against the direction of flow of the resin, it is preferable that a total of two protrusions 21a are provided, one on either side in the vicinity of the base of the leg portion 17a of the terminal 17.

The length in a direction toward the lower die 22 of the protrusion 21a of the upper die 21 of the molding die 20 shown in FIGS. 5A to 5C is greater than the thickness of the leg portion 17e of the terminal 17. Because of this, the protrusion 21a positioned behind the terminal 17 appears in the drawing in FIG. 5A, while the protrusion 21a is depicted as being longer than the leg portion 17a of the terminal 17 in FIG. 5C. However, a molding die for molding the resin case 15 of the semiconductor device 10 of the invention is not limited to one wherein the length of the protrusion provided in the upper die is greater than the thickness of the leg portion 17a of the terminal 17.

Figure 6A:
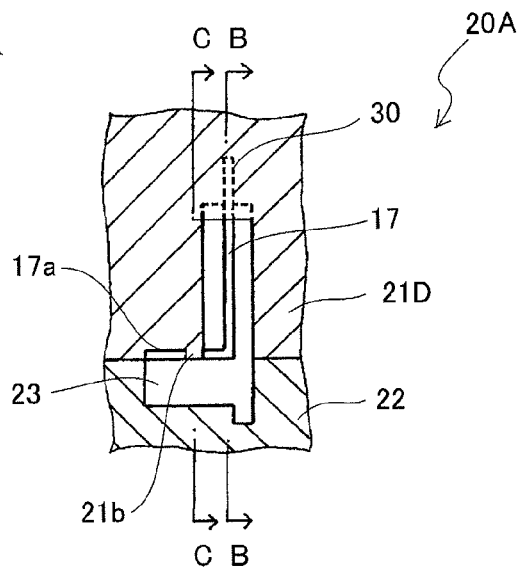
Figure 6B:
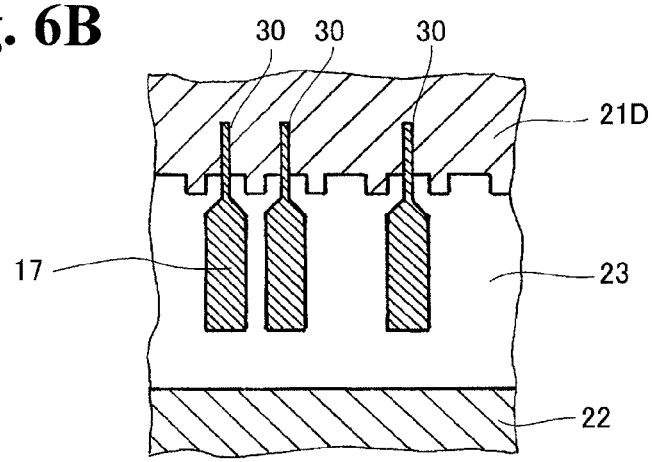
Figure 6C:
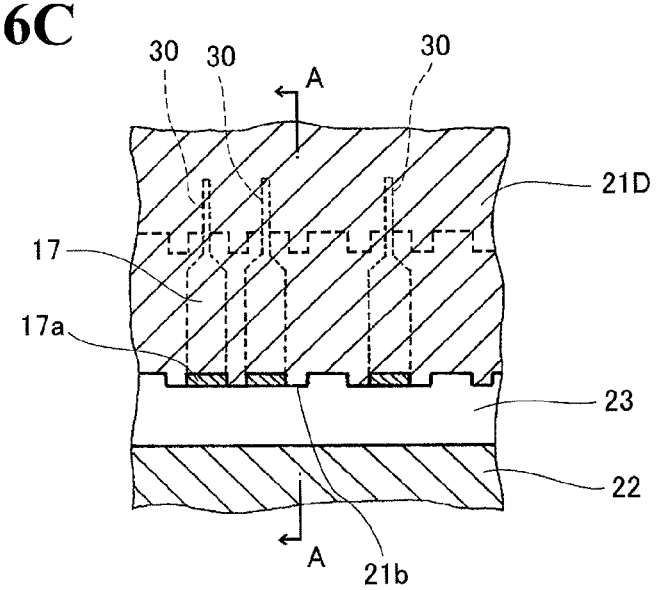

A modification example of a molding die for molding the resin case 15 is shown as partial cross-sectional views in FIGS. 6A to 6C. In FIGS. 6A to 6C, the same reference numbers are given to members the same as in FIGS. 5A to 5C, and a redundant description will be omitted hereafter. A molding die 20A of FIGS. 6A to 6C differs from the molding die 20 of FIGS. 5A to 5C in that the length in a direction toward the lower die 22 of a protrusion 21b provided in the same position as the protrusion 21a provided in the upper die 21 of the molding die 20 in FIGS. 5A to 5C is of the same extent as the thickness of the leg portion 17a of the terminal 17. Because of this, the protrusion 21b positioned in front of the terminal 17 in FIG. 6A showing the cross-sectional view taken along the line A-A of FIG. 6C, is depicted as being of a length the same as the thickness of the leg portion 17a of the terminal 17, while the protrusion 21b adjacent to the leg portion 17a of the terminal 17 is depicted as being of a length the same as the thickness of the leg portion 17a of the terminal 17 in FIG. 6C. Even when the length of the protrusion 21b of an upper die 21D is the same as the thickness of the leg portion 17a of the terminal 17 in the molding die 20A of FIGS. 6A to 6C, it is possible to provide all of the advantages of the molding die 20 described previously using FIGS. 5A to 5C. Indeed, as there is less concern of leading to damage such as bending of the protrusion 21b, it may even be preferable that the length of the protrusion 21b of the upper die 21D is short to the extent of being the same as the thickness of the leg portion 17a of the terminal 17.

Figure 7:
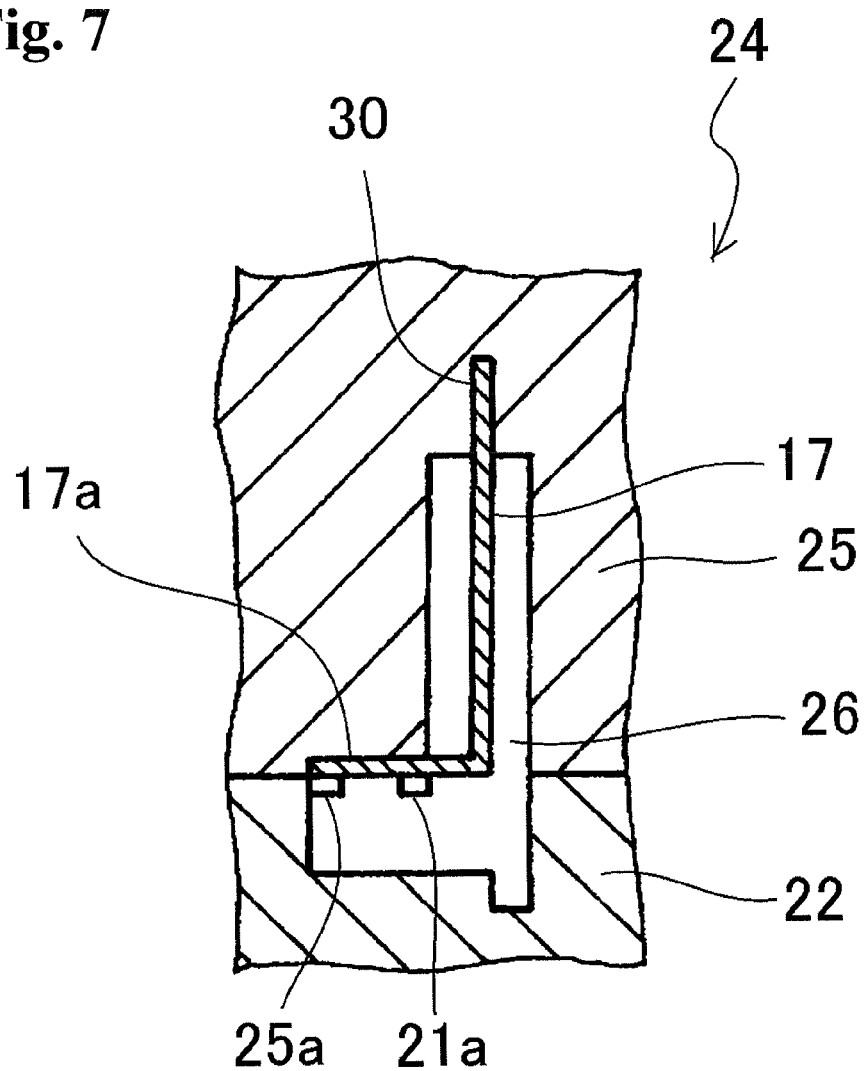
FIG. 7 is a partial cross-sectional view of a modification example of a molding die.

A modification example of a molding die wherein deviation in the position of the terminal 17 is prevented is shown as a partial cross-sectional view in FIG. 7. A molding die 24 shown in FIG. 7 is configured of an upper die 25 and the lower die 22, and a cavity 26 is formed by the upper die and lower die close contacting each other. The plurality of terminal 17 is individually held in the upper die 25. When contrasting the molding die 24 shown in FIG. 7 with the molding die 20 shown in FIG. 5A, it differs in that, in addition to the protrusion 21a, a protrusion 25a is provided in a position corresponding to the vicinity of a leading end portion of the leg portion 17a of the terminal 17 in the upper die 25. By the protrusion 21a and protrusion 25a being provided in the upper die 25 in the modification example shown in FIG. 7, it is not only possible to prevent deviation in the position of the terminal 17 in the vicinity of the base of the leg portion 17a, but also possible to prevent deviation in the position of the terminal 17 in the vicinity of the leading end portion of the leg portion 17a. Therefore, it is possible to more reliably fix the terminal 17 in the predetermined position.

Although the length in a direction toward the lower die 22 of the protrusions 21a and 25a of FIG. 7 is greater than the thickness of the leg portion 17a of the terminal 17, the example shown in the drawing is not limiting. The length in a direction toward the lower die 22 of the protrusions 21a and 25a of FIG. 7 may be of the same extent as the thickness of the leg portion 17a of the terminal 17, in the same way as the protrusion 21b of FIGS. 6A to 6C.

Figure 8:
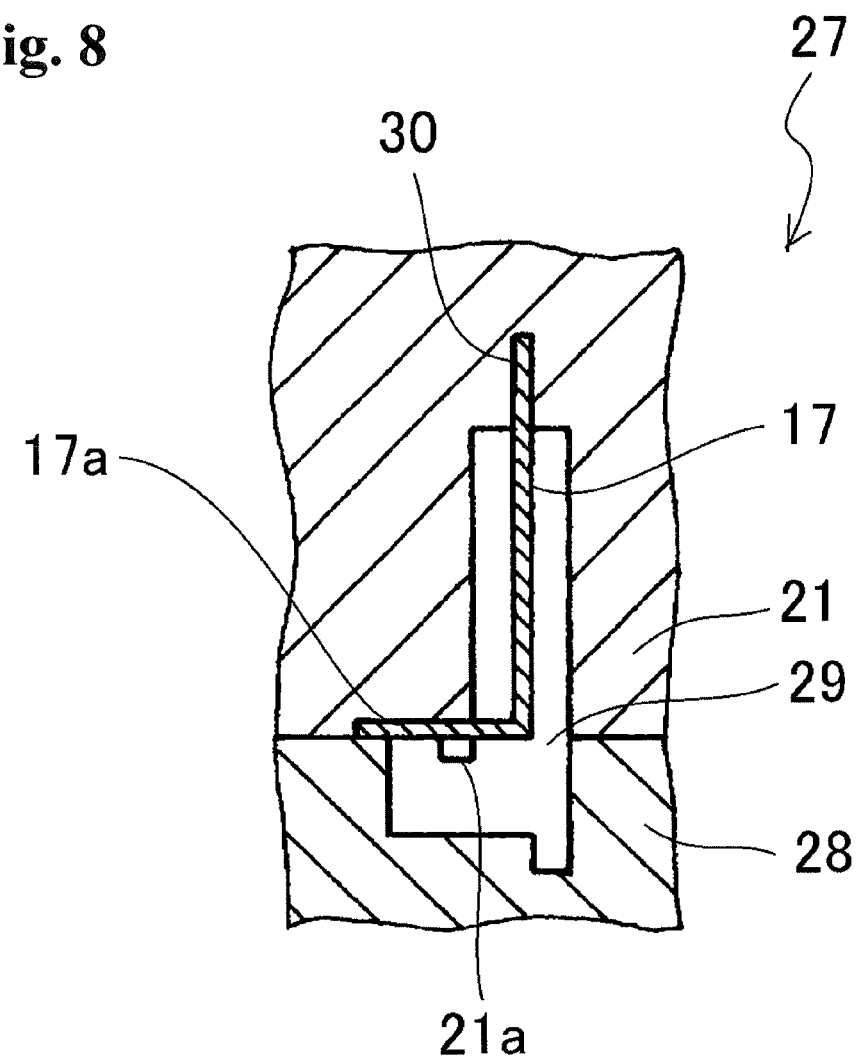
FIG. 8 is a partial cross-sectional view of a modification example of a molding die.

Another modification example of a molding die wherein deviation in the position of the terminal 17 is prevented is shown as a partial cross-sectional view in FIG. 8. A molding die 27 shown in FIG. 8 is configured of the upper die 21 and a lower die 28, and a cavity 29 is formed by the two coming into close contact. The plurality of terminal 17 is individually held in the upper die 21. When contrasting the molding die 27 shown in FIG. 8 with the molding die 20 shown in FIG. 5A, it differs in that, in addition to the protrusion 21a being provided, a leading end portion of the leg portion 17a of the terminal 17 is clamped by the upper die 21 and lower die 28. By the protrusion 21a being provided in the upper die 21 and the leading end portion of the leg portion 17a of the terminal 17 being clamped by the upper die 21 and lower die 28 in the modification example shown in FIG. 8, it is not only possible to prevent deviation in the position of the terminal 17 in the vicinity of the base of the leg portion 17a, but also possible to prevent deviation in the position of the terminal 17 in the vicinity of the leading end portion of the leg portion 17a. Therefore, it is possible to more reliably fix the terminal 17 in the predetermined position.

Although the length in a direction toward the lower die 22 of the protrusion 21a of FIG. 8 is greater than the thickness of the leg portion 17a of the terminal 17, the example shown in the drawing is not limiting. The length in a direction toward the lower die 22 of the protrusion 21a of FIG. 8 may be of the same extent as the thickness of the leg portion 17a of the terminal 17, in the same way as the protrusion 21b of FIGS. 6A to 6C.

When holding the plurality of terminals 17 in the heretofore described molding die 20, 20A, 24, or 27, the terminals 17 may be held one by one, but in this case, the number of holding operations increases in direct proportion to the number of terminals. Because of this, there is concern about the operation cost increasing, and mass productivity deteriorating. Therefore, it is preferable that all the terminals 17 to be held in one molding die are held at one time, as it is thus possible to reduce the operation cost. In order that all the terminals 17 are held at one time, for example, the following is carried out.

A jig (receiving jig), into which the plurality of terminal 17 can be inserted and held in the same predetermined positions as those in which they are to be held in the molding die, and to the same predetermined quantity, and a jig (transfer jig), which can move the plurality of terminals 17 held in the receiving jig at one time with the positions and quantity as they are, are prepared in advance. The plurality of terminals 17 is held in the predetermined positions and to the predetermined quantity in the receiving jig, and next, the plurality of terminals 17 held in the receiving jig is held in the molding die 20, 20A, 24, or 27, all at one time, by the transfer jig. In order to hold the plurality of terminals 17 in the predetermined positions and to the predetermined quantity in the receiving jig, it is possible to use a numerically-controlled robot that can hold the terminals 17 based on data on the positions and number of terminals in the molding die. The terminals supplied to the numerically-controlled robot are, for example, terminals obtained from a reel terminal via a bending process and cutting process. Also, the transfer jig is a jig such that, for example, the terminals 17 can be temporarily fixed to the transfer jig by air adsorption or mechanical gripping.

IL is also possible to automate the operation of holding the terminals 17 using a terminal insertion device that inserts the terminals into the molding die based on data on the positions and number of terminals in one resin case, thus achieving a reduction in the operation cost and an improvement in mass productivity.

The resin case 15 provided with the terminal 17 and manufactured in the way heretofore described is joined with the adhesive 16 to an assembly of the semiconductor chip 11, insulating circuit substrate 12, and heat releasing substrate 14 in the semiconductor device 10 of FIG. 1. Also, the terminal 17 is wire-bonded with the bonding wire 18 to the conductor layer 12b of the insulating circuit substrate 12 or to the semiconductor chip 11. Furthermore, the inside of the resin case 15 is filled with the sealing resin 19.

Next, a description will be given of the resin case 15 in which the terminal 17 is provided. FIG. 9A is a partial plan view of the side wall portion 15b of the resin case 15, FIG. 9B is a partial side view of the side wall portion 15b viewed from the inner surface side, and FIG. 9C is a partial cross-sectional view cut along the line X-X of FIG. 9A. The resin case 15 shown is formed by the resin case 15 and plurality of terminals 17 being integrally molded. Also, the resin case 15 is such that protrusion marks 15d are formed as depressed portions in the vicinity of the base of the leg portion 17a of the terminals 17. The protrusion marks 15d are formed by the protrusions 21a provided in the upper die 21 of the molding die 20.

A description will be given, using FIGS. 10A to 10C, of a modification example of a resin case in which the terminal 17 is provided. FIG. 10A is a partial plan view of the side wall portion 15b of a resin case 15G, FIG. 10B is a partial side view of the side wall portion 15b viewed from the inner surface side, and FIG. 10C is a partial cross-sectional view cut along the line X-X of FIG. 10A. The resin case 15G shown is formed by the resin case 15G and plurality of terminals 17 being integrally molded. Also, the resin case 15G is such that protrusion marks 15f are formed as depressed portions in the vicinity of the base of the leg portion 17a of the terminals 17. The protrusion marks 15f are formed by the protrusions 21b provided in the upper die 21D of the molding die 20A.

A description will be given, using FIGS. 11A and 11B, of a modification example of a resin case in which the terminal 17 is provided. FIG. 11A is a partial plan view of a side wall portion 35b of a resin case 35, and FIG. 11B is a partial cross-sectional view cut along the line X-X of FIG. 11A. When contrasting the resin case 35 shown in FIGS. 11A and 11B with the resin case 15 shown in FIGS. 9A to 9C, it differs in that, in addition to the protrusion marks 15d being formed in the vicinity of the base of the leg portion 17a of the terminals 17, protrusion marks 15e are formed in the vicinity of the leading end portion of the leg portions 17a. The protrusion marks 15e are formed by the protrusions 25a provided in the upper die 25 of the molding die 24.

A description will be given, using FIGS. 12A and 12B, of another modification example of a resin case in which the terminal 17 is provided. FIG. 12A is a cross-sectional view of a side wall portion 45b of a resin case 45, and FIG. 12B is a partial cross-sectional view cut along the line X-X of FIG. 12A. When contrasting the resin case 45 shown in FIGS. 12A and 12B with the resin case 15 shown in FIG. 9C, it differs in that, in addition to the protrusions mark 15d being formed in the vicinity of the base of the leg portion 17a of the terminals 17, the leading end portion of the leg portion 17a is such that not only the front surface, to which the bonding wire 18 is joined, but also the back surface is exposed from the resin case 45. The leading end portion of the leg portion 17a being exposed on the front and back surfaces is because of the vicinity of the leading end portion of the leg portion 17a being clamped by the upper die 21 and lower die 28 of the molding die 27.

A description will be given, using FIGS. 13A and 13S, of another modification example of a resin case in which the terminal 17 is provided. FIG. 13A is a cross-sectional view of a side wall portion 55b of a resin case 55, and FIG. 13B is a partial cross-sectional view cut along the line X-X of FIG. 13A. When contrasting the resin case 55 shown in FIGS. 13A and 13B with the resin case 15 shown in FIG. 9C, it differs in that the thickness of the side wall portion 55b in the vicinity of the base of the leg portion 17a of the terminal 17 is greater than that of the upper side of the side wall portion 55b. By the thickness of the side wall portion 55b in the vicinity of the base of the leg portion 17a being greater than that of the upper side of the side wall portion 55b, it is possible to increase the strength of the side wall portion in the vicinity of the base of the leg portion 17a.

All of the resin cases 15, 15G, 35, 45, and 55 can be manufactured using one kind of resin chosen from a polyphenylene sulfide resin (PPS resin), a polybutylene terephthalate resin (PBT resin), a polyamide resin (PA resin), or an acrylonitrile butadiene styrene resin (ABS resin), and it is thus possible to provide superior electrical insulating properties.

The heretofore described embodiments show specific examples of the invention, the invention is therefore not limited to these embodiments, and it goes without saying that various modifications are possible without departing from the scope of the invention.

For example, in the heretofore described example, a description has been given of a manufacturing method whereby, using the terminals 17 of the same form, insert molding is carried out with the molding die 20 wherein the protrusions 21a are provided at practically equal intervals, but terminals of differing widths and thicknesses may be prepared, and molding carried out with a molding die wherein a plurality of protrusions for positioning are provided at intervals adapted to the terminals. Provided that terminals of differing forms are used as main terminals and control terminals, and molding is carried out with a molding die in which are provided protrusions for holding each of the terminals in a predetermined position, it is possible to provide at low cost a semiconductor device manufacturing method whereby terminals of differing forms are included, and it is possible to respond to differing terminal arrays.

What is claimed is:

1. A semiconductor device, comprising:
an insulating circuit substrate mounted with at least one semiconductor element;
a resin case provided with a plurality of terminals having leg portions; and
protrusion marks formed in vicinities of the leg portions of the plurality of terminals of the resin case,
wherein the plurality of terminals and the resin case are integrally molded using a molding die, and the protrusion marks are marks where protrusions for fixing the plurality of terminals in predetermined positions in the molding die are placed.

2. The semiconductor device according to claim 1, wherein the protrusion marks are formed in vicinities of bases of the leg portions of the terminals.

3. The semiconductor device according to claim 2, wherein other protrusion marks are formed in vicinities of leading end portions of the leg portions of the terminals.

4. The semiconductor device according to claim 2, wherein a front surface and a back surface of a leading end portion of the leg portion of each of the terminals are exposed from the resin case.

5. The semiconductor device according to claim 1, wherein a thickness of a side wall portion of the resin case in a vicinity of a base of the leg portion of each of the terminals is greater than that of the other portions of the side wall portion.

6. The semiconductor device according to claim 1, wherein the resin case is formed from a polyphenylene sulfide resin, a polybutylene terephthalate resin, a polyamide resin, or an acrylonitrile butadiene styrene resin.

* * * * *

UNITED STATES PATENT AND TRADEMARK OFFICE
CERTIFICATE OF CORRECTION

PATENT NO.       : 9,070,696 B2
APPLICATION NO.  : 14/251036
DATED            : June 30, 2015
INVENTOR(S)      : Onishi et al.

Page 1 of 1

It is certified that error appears in the above-identified patent and that said Letters Patent is hereby corrected as shown below:

In the specification

Column 1, line 43, delete "joined Lo the ..." insert --joined to the ...--.

Column 4, line 21, delete "FIGS. 10A to 100 ..." insert --FIGS. 10A to 10C ...--.

Column 4, line 50, delete "... semiconductor chip is ..." insert --... semiconductor chip 11 is ...--.

Column 6, line 10, delete "... terminal 17 to he" insert --... terminal 17 to be--.

Column 7, line 17, delete "... terminals in the" insert --... terminals 17 in the--.

Column 7, line 31, delete "leg portion 17e ..." insert --leg portion 17a ...--.

Column 9, line 25, delete "IL is also possible ..." insert --It is also possible ...--.

Column 10, line 29, delete "... 13A and 135, of" insert --... 13A and 13B, of--.

In the claims

Column 12, line 5, delete "... aback surface ..." insert --... a back surface ...--.

Signed and Sealed this
Fifteenth Day of December, 2015

Michelle K. Lee
*Director of the United States Patent and Trademark Office*